(12) United States Patent
Duminica et al.

(10) Patent No.: US 9,805,918 B2
(45) Date of Patent: Oct. 31, 2017

(54) PLASMA SOURCE

(71) Applicant: ARCELORMITTAL INVESTIGACIÓN Y DESARROLLO SL, Sestao (ES)

(72) Inventors: Florin Daniel Duminica, Esneux (BE); Vincent LeClercq, Thimister (BE); Eric Silberberg, Haltinne (BE); Alain Daniel, Hannut (BE)

(73) Assignee: ARCELORMITTAL INVESTIGACIÓN Y DESARROLLO SL, Sestao (ES)

( * ) Notice: Subject to any disclaimer, the term of this patent is extended or adjusted under 35 U.S.C. 154(b) by 0 days.

(21) Appl. No.: 14/765,817

(22) PCT Filed: Feb. 6, 2013

(86) PCT No.: PCT/EP2013/052340
§ 371 (c)(1),
(2) Date: Aug. 4, 2015

(87) PCT Pub. No.: WO2014/121831
PCT Pub. Date: Aug. 14, 2014

(65) Prior Publication Data
US 2016/0005575 A1 Jan. 7, 2016

(51) Int. Cl.
*H01J 37/32* (2006.01)
*H05H 1/46* (2006.01)
*C23C 16/50* (2006.01)

(52) U.S. Cl.
CPC ........ *H01J 37/32871* (2013.01); *C23C 16/50* (2013.01); *H01J 37/3244* (2013.01);
(Continued)

(58) Field of Classification Search
CPC ............ H01J 37/32871; H01J 37/3266; H01J 37/32669; H01J 37/3244; H01J 37/32541;
(Continued)

(56) References Cited

U.S. PATENT DOCUMENTS 5,865,961 A * 2/1999 Yokoyama ............... C23C 14/35
204/192.12
6,153,067 A * 11/2000 Maishev ................ C23C 14/228
204/298.04
(Continued)

FOREIGN PATENT DOCUMENTS

WO 95/25420 A1 9/1995

OTHER PUBLICATIONS

International Search Report dated Oct. 25, 2013, issued in corresponding International Application No. PCT/EP2013/052340, filed Feb. 6, 2013, 2 pages.

*Primary Examiner* — Jimmy Vu
*Assistant Examiner* — Henry Luong
(74) *Attorney, Agent, or Firm* — Christensen O'Connor Johnson; Laura Cruz; John Denkenberger

(57) ABSTRACT

The invention relates to a plasma source (1) for depositing a coating onto a substrate (9), which is connectable to a power source (P) and includes: an electrode (2); a magnetic assembly (4) located circumferentially relative to said electrode and including a set of magnets mutually connected by a magnetic bracket (46) including a first and second central magnet (43, 44) and at least one head magnet (45); and an electrically insulating enclosure (5) arranged such as to surround the electrode and the magnets.

15 Claims, 7 Drawing Sheets

(52) U.S. Cl.
CPC .... *H01J 37/3266* (2013.01); *H01J 37/32541* (2013.01); *H01J 37/32568* (2013.01); *H01J 37/32623* (2013.01); *H01J 37/32669* (2013.01); *H05H 1/46* (2013.01); *H01J 2237/3321* (2013.01); *H01J 2237/3323* (2013.01); *H05H 2001/466* (2013.01)

(58) Field of Classification Search
CPC .......... H01J 37/32559; H01J 37/32568; H01J 37/32623; H01J 2237/332; H01J 2237/3321; H01J 2237/3326; H05H 1/0087; H05H 2007/087
USPC ....................... 315/111.41; 313/35, 154, 158
See application file for complete search history.

(56) References Cited

U.S. PATENT DOCUMENTS

| | | | |
|---|---|---|---|
| 6,251,242 B1 * | 6/2001 | Fu .......................... | C23C 14/35 |
| | | | 204/192.2 |
| 6,436,251 B2 * | 8/2002 | Gopalraja ............. | C23C 14/046 |
| | | | 204/298.12 |
| 2004/0082187 A1 | 4/2004 | Chistyakov | |
| 2005/0194910 A1 | 9/2005 | Vukovic | |
| 2006/0157347 A1 * | 7/2006 | Hartig ................... | C23C 14/352 |
| | | | 204/298.16 |
| 2006/0284562 A1 | 12/2006 | Hruby | |
| 2007/0205096 A1 * | 9/2007 | Nagashima ........... | C23C 14/351 |
| | | | 204/192.12 |

* cited by examiner

PLASMA SOURCE

SUMMARY

The present invention relates to a plasma source intended for the depositing of a coating on a substrate. This invention therefore relates to a plasma source for the deposition of a coating on a substrate and able to be connected to a power source.

The main application of the invention is Plasma Enhanced Chemical Vapour Deposition (PECVD) which is used to deposit a thin layer of a coating on a substrate from a precursor in gaseous phase.

The principle of such deposition is simple since it entails generating a plasma in which the products derived from the decomposition of a precursor gas are deposited on the substrate and form the deposit.

Within this application a broad panel of substrates and coatings can be envisaged. The substrates most frequently treated by PECVD are dielectric materials such as some polymers and glass, conductive metals and semiconductors. A wide variety of coatings can be deposited on these substrates such as adamantine carbon known under the generic name Diamond-like Carbon (DLC) or silicon dioxide ($SiO_2$), tin dioxide ($SnO_2$) zirconium dioxide ($ZrO_2$) or titanium dioxide ($TiO_2$). These coatings are used for example to protect the substrate by depositing an abrasion-resistant film on its surface; to obtain an anti-reflective effect or to create an anti-fingerprint layer; or to impart photocatalytic properties to the substrate used for the manufacture of self-cleaning surfaces.

The ionisation rate generated by the PECVD method is relatively low compared with other vacuum deposition processes, thereby leading to a small increase in the temperature of the substrate. This method is therefore particularly well suited for the treatment of heat-sensitive surfaces such as galvanised steel or painted steel.

From document WO2004/027825 a plasma source is known intended for depositing a coating on a substrate. This plasma source comprises an electrode delimiting a discharge cavity and allowing the positioning of the substrate to be coated opposite an aperture. The cross-section of the electrode comprises two side walls located either side of a bottom portion. A magnet assembly is located on the periphery of the electrode and comprises two side magnets arranged behind the side walls and oriented such that their poles facing each other are of same polarity, and a magnet support located on the periphery of the electrode which connects the two magnets. The two side magnets generate outwardly directed field lines i.e. field lines directed from the side magnets towards the outside of the discharge cavity passing through the aperture, and inwardly directed field lines i.e. field lines directed from the side magnets towards the inside of the discharge cavity.

When the source is in operation, electrons are pulled away from the surface of the electrode and come to be trapped in the magnetic field lines. In relation to the point from which an electron is pulled, it is trapped either in the inwardly directed field lines or in the outwardly directed field lines. The electrons trapped in the outward field lines leave the source via the aperture and generate a plasma outside the plasma source in which the precursor gas will decompose. However this plasma source has an aperture of smaller width than the width of the discharge cavity which perturbs ejection of the electrons and hence limits the density of the plasma. The quality of the coating and speed of deposit of the coating on the substrate are thereby diminished.

It is the objective of the invention to overcome the shortcomings of the prior art by providing a plasma source with which it is possible, with same power, to produce a denser, more uniform plasma subsequently allowing coatings of better quality to be obtained and in faster time.

To solve this problem, the plasma source such as first mentioned above comprises:
  a) an electrode delimiting a discharge cavity leading onto an aperture opposite which the said substrate can be positioned, the cross-section of the said electrode comprising a first and a second side wall positioned either side of a bottom part provided with a central portion protruding into the said discharge cavity, the said central portion comprising a first and a second central wall and a top part joining together the two central walls;
  b) a magnet assembly located on the periphery of the said electrode and comprising a set of magnets connected together by a magnet bracket, each of said magnets comprising an exposed pole directed towards the discharge cavity and a protected pole directed towards the said magnetic bracket, the said magnet assembly comprising:
    i) at least a first and a second side magnet, the said first side magnet respectively second side magnet being arranged behind the said first side wall and second side wall respectively, in the vicinity of the said aperture, the said side magnets being oriented such that their exposed poles have the same polarity;
    ii) at least a first and a second central magnet, the said first central magnet and second central magnet respectively being arranged behind the said first central wall and second central wall respectively, the said two central magnets being oriented such that their exposed pole is of opposite polarity to that of the exposed poles of the side magnets;
    iii) at least one head magnet arranged behind the said top part and oriented such that its exposed pole is of same polarity as that of the exposed poles of the side magnets;
  c) an electrically insulating enclosure arranged so as to surround the electrode and the magnets without obstructing the said aperture.

It is therefore provided according to the invention to add to the side magnets at least two central magnets and at last one head magnet arranged behind the walls of a central portion of the electrode. This assembly of at least three magnets allows modification of the configuration of the magnetic field lines and in particular increases the density of the outwardly directed field lines. When the plasma source is in operation, the effect of this densification is to trap a greater number of electrons and ions in the field lines outside the plasma source and in the vicinity of the substrate to be coated. Therefore, with same power, a denser plasma is obtained and the depositing of the coating on the substrate is accelerated.

In addition, this assembly of at least three magnets increases the density of the inwardly directed field lines. When the plasma source is in operation, the effect of this densification is to concentrate the electrons within these field lines. This reservoir of electrons contributes towards the stability of the plasma. It is therefore possible to operate at a pressure termed high pressure, namely up to a few mbar e.g. between 0.001 and 1 mbar, whereas in the state of the art the maintained pressure must be lower than 0.05 mbar. This is also a non-negligible advantage in that a weaker vacuum generates lower operating costs and a more favourable energy balance since the voltage required to generate the plasma is lower than 400 V.

The plasma source of the invention may also comprise the optional characteristics given in the dependent claims, these optional characteristics possibly being taken alone or in combination.

Advantageously the aperture of the plasma source of the invention has the same width as the discharge cavity.

In one preferred embodiment, the magnetic bracket is E-shaped, the middle bar of which comprises an enlarged end portion so that the protected pole of the head magnet is fully in contact with the magnetic bracket.

Preferably the magnetic bracket is formed in a single piece.

Advantageously, the plasma source comprises means for cooling the magnets and electrode.

In one preferred embodiment the cooling means comprise a space arranged between the electrode and the magnet assembly and intended for circulation of a heat-exchange fluid.

Advantageously, the cooling means comprise a pipe circuit.

More particularly the plasma source further comprises injection means intended to inject an ionisable gas into the discharge cavity.

In one preferred embodiment of the invention, the injection means are positioned in the vicinity of the bottom part.

Other embodiments of the plasma source according to the invention are indicated in the appended claims.

The present invention also relates to vacuum deposition equipment comprising a plasma source according to the present invention.

Advantageously the deposition equipment further comprises a second plasma source of the invention, the two plasma sources being intended for dual operation.

In one advantageous variant, the axes of symmetry of the two plasma sources form an angle α of between 20 and 110°.

Preferably, in the equipment of the invention, the poles facing each other of the side magnets of the first plasma source have opposite polarity to the polarity of the facing poles of the side magnets of the second plasma source.

Advantageously the equipment of the invention additionally comprises a precursor gas injector.

Other embodiments of the equipment are indicated in the appended claims.

Other characteristics, details and advantages of the invention will become apparent from the description below that is non-limiting and given with reference to the appended drawings:

DETAILED DESCRIPTION

In the Figures, identical or similar elements carry the same reference numbers. A plasma source according to the invention is described in connection with FIGS. 1 to 3.

Figure 1:
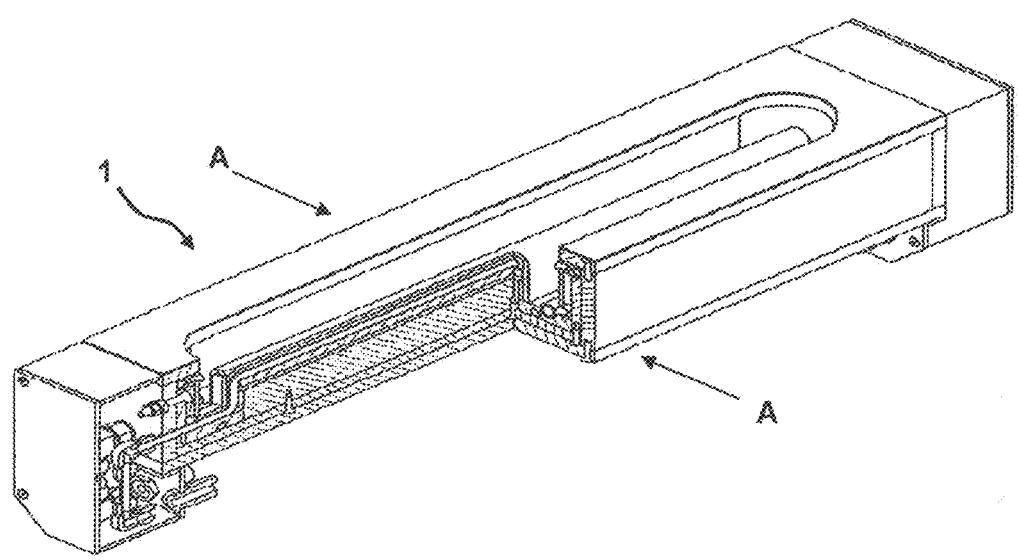
FIG. 1 is a perspective cutaway view of a plasma source according to the invention.

With reference to FIG. 1, the plasma source of this embodiment is of elongate parallelepiped shape. This shape is desired in this case where the plasma source is intended for the depositing of a coating on a travelling metal strip of large width. To obtain good uniformity of deposit it is preferable that the plasma source should be longer than the width of the metal strip. Alternatively and for other uses, the plasma source could take on other shapes such as a toroid shape for example.

Figure 2:
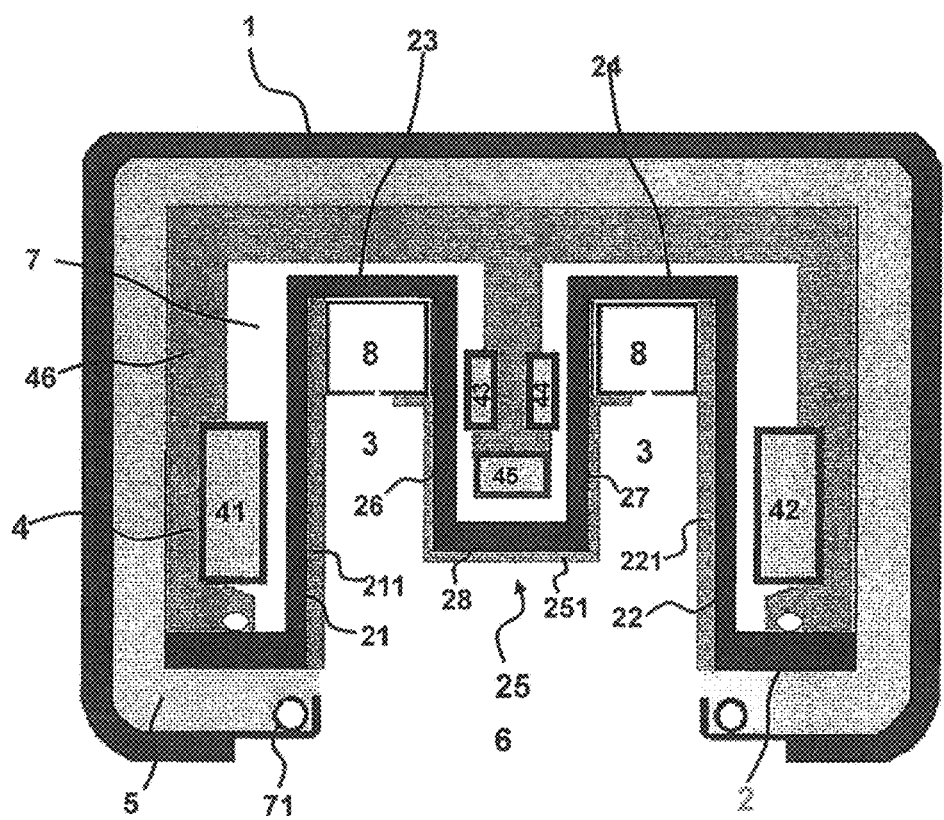
FIG. 2 is a schematic cross-sectional view along axis A-A of the plasma source in FIG. 1.

With reference to FIG. 2, the plasma source 1 comprises an electrode 2 having a cross-section that is approximately E-shaped and which delimits a discharge cavity 3, a magnet assembly 4 located on the periphery of the electrode and an electrically insulating enclosure 5 having a cross-section that is approximately U-shaped so as to surround the electrode and the magnet assembly whilst leaving an aperture 6 leading onto the discharge cavity 3.

The electrode 2 first comprises a first side wall 21 and a second side wall 22 corresponding to the lower and upper bars of the E. These two side walls also form the side walls of the discharge cavity. The first side wall 21, and second side wall 2 respectively, is connected via a bottom part 23, respectively 24, to a central portion 25 corresponding to the middle bar of the E.

The central portion 25 consists of a protrusion into the discharge cavity and is formed by two central walls 26, 27 and a top part 28 linking together the two central walls. The electrode assembly is formed of a non-magnetic conductive material such as copper, Al, Ti, 316 stainless steel from which the electrons will be pulled when the plasma source is in operation. Preferably, the electrode is formed in a single piece since this piece can be used as cooling wall. However it is possible alternatively to have recourse to a set of parts assembled together to form the electrode. In addition, to limit degradation of the electrode subjected to ion bombardment, the electrodes can be protected by plates 211, 221 and 251 formed of non-magnetic metal conductors such as aluminium, 316 stainless steel and Ti.

The magnet assembly 4 comprises a set of magnets linked together by means of a magnetic bracket and arranged so as to generate particularly dense outwardly directed magnetic field lines in the vicinity of the aperture 6.

Preferably, the magnets are permanent magnets and are selected from among the groups of magnets of NdFeB or SmCo type.

The magnet assembly 4 first comprises a first side magnet 41 arranged behind the first side wall of the electrode in the vicinity of the aperture 6. Symmetrically, a second side magnet 42 is arranged behind the second side wall of the electrode in the vicinity of the aperture 6.

The said magnets 41 and 42 each comprise an exposed pole directed towards the discharge cavity and a protected pole directed towards the insulating enclosure. The two side magnets are oriented in such manner that their exposed poles which face one another are of same polarity.

The magnet assembly 4 also comprises a first central magnet 43 arranged behind the first central wall 26 of the electrode in the vicinity of the bottom part 23. Symmetrically, a second central magnet 44 is arranged behind the second central wall 27 of the electrode in the vicinity of the bottom part 24.

The central magnets 43 and 44 each comprise an exposed pole directed towards the discharge cavity and a protected pole directed towards the inside of the central portion. The two side magnets are oriented in such manner that their exposed poles are of opposite polarity to the polarity of the two exposed poles of the said magnets 41 and 42.

Finally the magnet assembly 4 comprises a head magnet 45 positioned behind the top part 28 of the central portion 25. This magnet comprises an exposed pole directed towards the discharge cavity and a protected pole directed towards the inside of the central portion. It is oriented in such manner that its exposed pole is of same polarity as the polarity of the exposed poles of the side magnets 41 and 42.

All the magnets of the magnet assembly are linked together by means of a magnetic bracket 46 positioned on the periphery of the electrode. In the example in FIG. 2 its cross-section is approximately E-shaped. For the electrode to be operational, all that is required is that each magnet should be in contact at one point at least with the magnetic bracket. However to avoid magnetic leakage, care is preferably taken so that the protected pole of each magnet is fully in contact with the magnetic bracket. For this purpose, the magnetic bracket given in the example in FIG. 2 is E-shaped with the middle bar having an enlarged end so that the protected side of the magnet 45 is fully in contact with the magnetic bracket.

Preferably, and again for the purpose of preventing magnetic leakage, the magnetic bracket is formed of a single piece. However to facilitate assembly recourse can be had to a set of parts assembled together to form a continuous assembly.

The magnetic bracket 46 is formed of any material having relatively high magnetic permeability, preferably higher than 2000, such as Mumetal®, Permalloy® steels and Ni, Fe and Co metals.

The respective orientations of the magnets can be summarised in following Tables 1 and 2 which illustrate two variants:

TABLE 1

| Magnet | Polarity | |
|---|---|---|
| | Exposed pole | Protected pole |
| Side magnet 41 | N | S |
| Side magnet 42 | N | S |
| Central magnet 43 | S | N |
| Central magnet 44 | S | N |
| Head magnet 45 | N | S |

TABLE 2

| Magnet | Polarity | |
|---|---|---|
| | Exposed pole | Protected pole |
| Side magnet 41 | S | N |
| Side magnet 42 | S | N |
| Central magnet 43 | N | S |
| Central magnet 44 | N | S |
| Head magnet 45 | S | N |

As illustrated in FIG. 2, the arrangement and orientation of the magnets such as described above have the following effects:

the side magnets 41 and 42 generate outwardly directed field lines i.e. field lines directed from the side magnets towards outside the discharge cavity passing through the aperture 6, and inwardly directed field lines i.e. field lines directed from the side magnets towards the inside of the discharge cavity and in particular towards the central portion;

the head magnet 45 chiefly generates outwardly directed field lines produced in addition to those produced by the side magnets, and thereby substantially increasing the density of the outwardly directed field lines and improving the efficacy of the plasma source as will be illustrated below;

the central magnets 43, 44 first allow the head magnet to be placed in contact with the magnetic bracket. In the absence of these magnets the central portion of the magnetic bracket would have the same polarity as the protected surface of the side magnets, in other words identical polarity to the polarity of the protected surface of the head magnet, the effect of which would be to repel the head magnet that it is desired to place in position. On the contrary, in the presence of these magnets the central portion of the magnetic bracket has opposite polarity to the polarity of the protected surface of the side magnets since:

first the central magnets 43, 44 which have a protected surface with opposite polarity to the polarity of the protected surface of the side magnets were able to be attached to the magnetic bracket at the base of the central portion which then had the same polarity as the protected surface of the side magnets;

their attachment reversed the polarity of the end part of the central portion of the magnetic bracket, this end part now being in contact with the protected surface of the central magnets;

in addition, the central magnets 43, 44 allow intensification of the inwardly directed field lines by means of the magnetic loops generated between these magnets and the side magnets via the magnetic bracket.

In other words, the magnet assembly induces:

a) a region 100 with dense outwardly directed field lines, chiefly located outside the plasma source in the vicinity of the aperture;

b) two regions 101 in which the resulting magnetic field is null, located in the discharge cavity between the aperture and the top part of the central portion;

c) two regions 102 having a strong density of inwardly directed field lines, located either side of the central portion.

To optimise the configuration of the magnetic field lines, preferably the length of the side magnets is adjusted and the distance between the head magnet and the perpendicular bisector of the side magnets, so that the side magnets properly interact with the central magnets and so that the head magnet has balanced interaction both with the central magnets and with the side magnets. Preferably, the head magnet is positioned so that its exposed pole lies on the perpendicular bisector of the side magnets. Preferably the head magnet is positioned in the centre of the electrode. The distance between the exposed poles of the side magnets is preferably between 8 and 12 centimetres, The above description corresponds to the cross-section of the plasma source. However, since this cross-section is elongate, each of the above-described magnets may evidently consist of a succession of juxtaposed magnets aligned in the longitudinal direction of the plasma source and not simply a single magnet.

By means of their arrangement behind the side walls, central walls and top part, the magnets are insulated from the environment prevailing in the discharge cavity when the plasma source is in operation and are therefore not damaged. In addition, they can easily be cooled so that their temperature does not exceed the Curie point, the temperature at which they lose their magnetic properties. There is effectively a high risk of demagnetisation of the magnets if they are brought to temperatures such as those encountered in the discharge cavity during a magnetron discharge.

On this account, the plasma source preferably contains cooling means 7 to cool the magnets and electrode. As illustrated in FIG. 2, cooling can be ensured by circulating a heat-exchange fluid within a space 7 arranged between the electrode and magnet assembly. This type of cooling has the advantage of allowing the magnets to be electrically insulated from the electrode when an electrically insulating heat-exchange fluid such as demineralised water is circulated.

Figure 3:
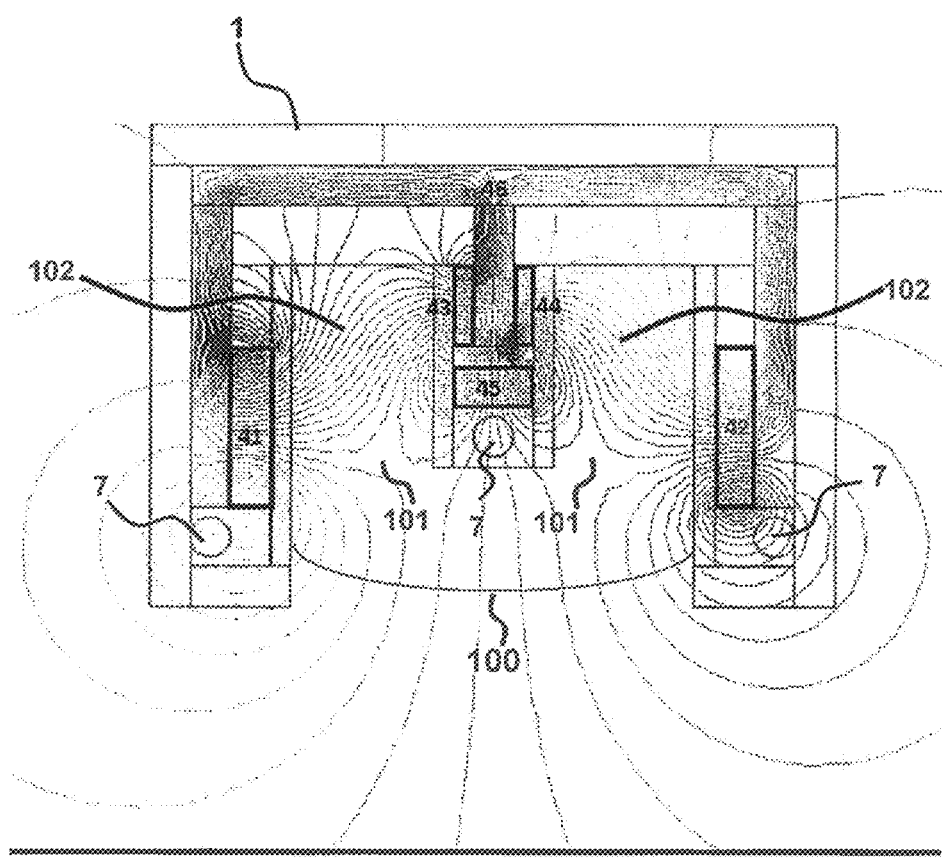
FIG. 3 is a schematic description of the configuration of the magnetic field lines of the plasma source illustrated in FIG. 2, generated inside and outside the plasma source.

Alternatively and as illustrated in FIG. 3, the cooling means 7 may be formed of a brazed pipe circuit passing through the thickness of the electrode or arranged in contact with the periphery thereof. When the plasma source is in operation cooling is ensured by circulation of water or other heat-exchange fluids in the piping.

Finally the plasma source 1 comprises an insulating enclosure having a cross-section that is approximately U-shaped so as to surround the electrode and the magnets whilst leaving an aperture 6. As will be seen further on in the description of the functioning of the device, it is not necessary for the aperture 6 to have a smaller width than the width of the discharge cavity as is the case with prior art devices. Preferably, the aperture 6 is the same width as the discharge cavity. The recourse to an insulating enclosure provides the guarantee that the electric discharges generated when the plasma source is in operation only originate from the electrode 2.

The insulating enclosure comprises an electrically insulating material, preferably a dielectric material selected from the group formed by micanites, Teflon, ceramic-containing resins . . .

During the operation of the electrode, the electronic and ionic bombardment may generate heating of the dielectric materials of the insulating enclosure 5, which may generate local mechanical stresses. To overcome this drawback, water-cooled plates 71 can be placed on the dielectric 5 either side of the aperture 6 as illustrated in FIG. 2.

Preferably, the plasma source also comprises injection means 8 to inject an ionisable gas into the discharge cavity. The shape and position of these injection means may be varied. Preferably the injection means are positioned in the vicinity of the bottom part 23 and/or bottom part 24 so that when the plasma source is in operation the ionisable gas circulates from the bottom parts towards the aperture 6. In the example in FIG. 2, the injection means are formed of injection pipes placed in front of the bottom parts 23 and 24 of the electrode, in the discharge cavity. Here the pipes are in stainless steel having orifices for uniform distribution of the gas over the length of the piping. Alternatively, the injection means may be partly integrated in the bottom parts. Preferably an injection means is arranged in the vicinity of each of the bottom parts 23 and 24 so that the ionisable gas is homogeneously distributed within the discharge cavity. The functioning and advantages of this injection system are described below.

A description will now be given of the plasma source in operation according to a first embodiment, as part of vacuum deposition equipment, with reference to FIG. 4.

First the plasma source is placed in a treatment chamber (not illustrated) held under a vacuum and arranged to house a substrate 9 preferably in the form of a travelling strip. The plasma source is arranged so that the aperture 6 faces the substrate 9 and preferably it is arranged substantially transverse to the direction of travel of the substrate strip 9.

The electrode 2 of the plasma source is connected to a power source P, typically a direct or alternate current source usually located outside the treatment chamber. In this first operating mode the travelling substrate 9 acts as counter-electrode and is grounded.

The treatment chamber also comprises at least one precursor gas injector 10. This injector may be secured to the plasma source in the vicinity of the aperture 6. Preferably however it is independent of the plasma source and is located close to the side edges of the plasma source to prevent injection of precursor gas in the direction of the discharge cavity which would contribute towards fouling thereof. In the example in FIG. 4, the injectors are formed of a network of pipes in porous stainless steel having high head loss and surrounded by pipes having orifices distributed so as to ensure uniform distribution of the gas over the entire length of the piping. However any known type of vacuum injector of precursor gas can be used here.

When the power source P is activated first a difference in electric potential is set up between the electrode 2 and the substrate. Under the effect of this difference in potential, electrons are pulled away from the surface of the electrode and become trapped in the magnetic field lines. In relation to the point from which an electron is pulled away, the electron will be trapped either in the inwardly directed field lines or in the outwardly directed field lines.

On account of the strong density of the outwardly directed field lines obtained by means of the special arrangement of the magnets of the invention, a large number of electrons are trapped in the outwardly directed field lines in the vicinity of the aperture 6 and close to the substrate 9.

The precursor gas injected in the direction of the space between the plasma source and the substrate is ionised in contact with the strong electronic density and thereby forms a plasma.

An ionisable gas is injected from the bottom of the discharge cavity via injection means 8. The force of injection pushes the ionisable gas towards the regions 102 having a strong density of inwardly directed field lines located either side of the central portion where it is ionised by colliding with the electrons trapped in the inwardly directed field lines.

One portion of these ions enters into collision with the walls of the electrode. This contributes towards preventing any fouling of the discharge cavity with products derived from decomposition of the precursor gas and likely to enter into the discharge cavity. The efficacy of this cleaning is such that it can eliminate the need for an aperture of narrower width than the cavity, further contributing towards facilitated exiting of the electrons from the plasma source and thereby contributing towards enhanced performance of the source.

In addition, the ions ejected from the plasma source bombard the substrate which imparts energy thereto and thereby contributes towards densifying the deposited layer.

Finally the ionisable gas pushes the precursor gas towards the substrate thereby limiting the formation of a deposit inside the plasma source.

Optionally the ionising gas may at the same time be a reagent gas able to react with the precursor gas.

To summarise, the effect of the densification of the outwardly directed field lines is to better concentrate the electrons and ions outside the plasma source and in the vicinity of the substrate to be coated. Therefore, with same power, a denser plasma is obtained and the depositing of the coating on the substrate is accelerated.

Figure 4:
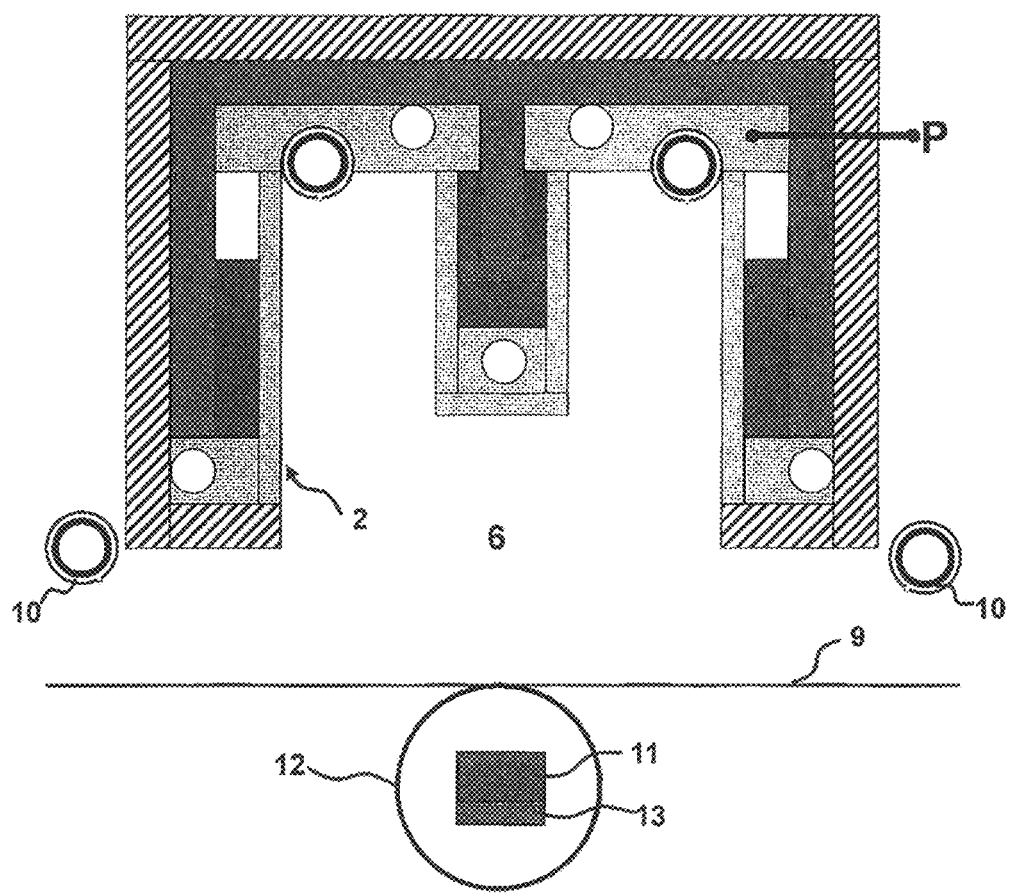
FIG. 4 is a schematic cross-sectional view of vacuum deposition equipment comprising a plasma source of the invention.

Optionally, and as can be seen in FIG. 4, the treatment chamber may contain an additional magnet 11 positioned facing the aperture 6, in the vicinity of the substrate on the side opposite the plasma source. For example it can be incorporated in a conveyor roll of the strip 12. Its exposed pole directed towards the plasma source 1 is of opposite polarity to that of the exposed poles of the side magnets. This additional magnet allows densification of the outwardly directed field lines in the vicinity of the substrate and thereby accelerates the depositing of the coating. However, since this densification leads to an increase in substrate temperature, the use of this additional magnet is to be avoided when treating substrates sensitive to temperatures in the order of a few hundred degrees.

If the magnet 11 is formed of a succession of juxtaposed magnets aligned in the longitudinal direction of the plasma source, these magnets are to be arranged on a magnetic bracket 13 in a manner to allow such juxtaposing.

Figure 5:
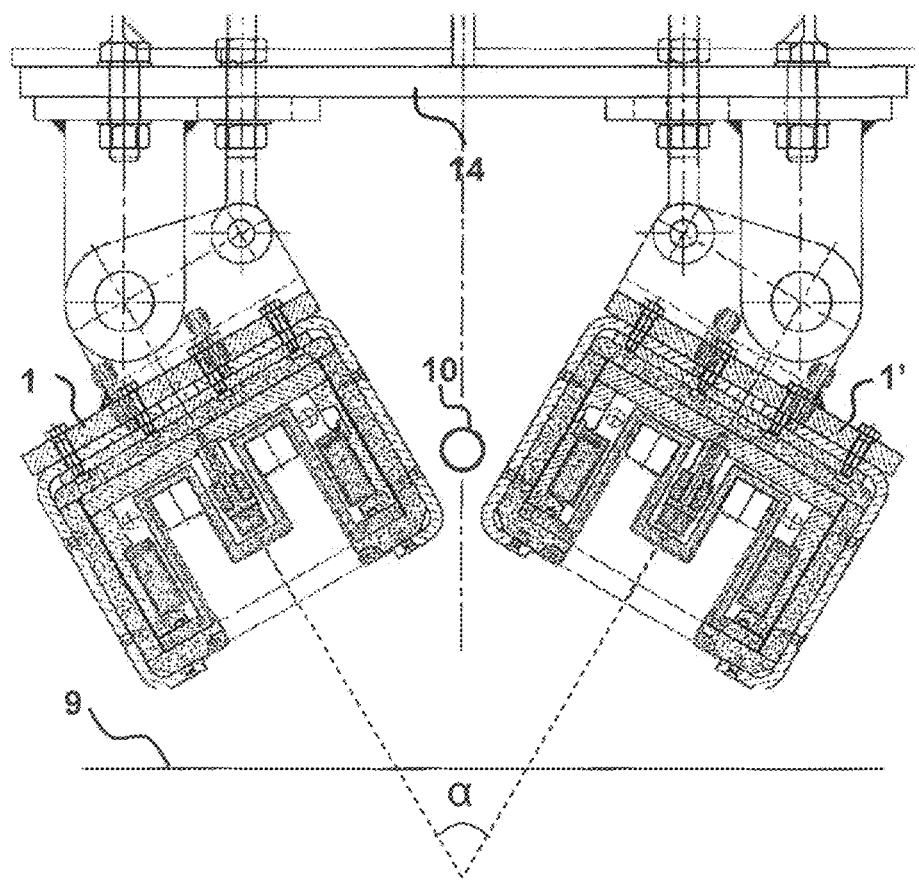
FIG. 5 is a schematic cross-sectional view of vacuum deposition equipment comprising two plasma sources of the invention and wherein the power source is an alternating current source.

As shown in FIG. 5, the plasma source is able to operate in vacuum deposition equipment according to a second mode. In this case, the treatment chamber comprises a second plasma source which acts as counter-electrode.

The power source P is then an alternating current source. To increase the electrical power of the large-size electrodes, several power sources can be synchronized.

The power source P is connected to the electrode 2 of the first plasma source 1 and to the counter-electrode 2' which is the electrode of the second plasma source 1', these two electrodes operating alternately as:

electron source, when the electrode acts as cathode;

and ion source when the electrode acts as anode, the gas ionised by the electrons derived from the cathode being expelled in the direction of the cathode and the substrate.

In this case the term dual operation is used.

Preferably, and as illustrated in FIG. 5, the two plasma sources are pivot-mounted on a horizontal arm 14 such that the two apertures 6 are tilted towards each other by an angle α formed by the axes of symmetry of the plasma sources. Angle α is between 20 and 110°, preferably between 40 and 90° and more preferably it is about 60°.

Said arrangement of the electrode and counter-electrode has the advantage of concentrating the beams of electrons and the precursor gas within a more confined space. With this confining it is easier to reach the activation energy of the precursor, which facilitates depositing.

The opposite-facing poles of the side magnets of the electrode may be of same polarity as the opposite-facing poles of the side magnets of the counter-electrode, or alternatively of opposite polarity. In this latter case the continuity of the field lines between the two electrodes facilitates deposition.

In this second operating mode the substrate 9, whether it is current conductive or electrically insulating, is electrically insulated from the plasma source. If the substrate to be treated is electrically conductive, the electrical insulation is ensured by grounding the substrate 9. One advantage of this operating mode is to allow the depositing of a dielectric coating on the substrate which is difficult to perform with a direct current source. For a said coating, mere direct current discharge will be insufficient since it will be rapidly extinguished. During the depositing operation, the surface of the substrate becomes charged under the impact of the ions. If the surface is an insulating surface the excess charge induced by the ion impacts is unable to move away. As a result the plasma is extinguished and depositing is unable to continue. This is the reason why sputtering under a direct current is generally only used for depositing conductive or semiconductive layers.

The tests conducted with plasma sources of the invention allowed the demonstration that the central magnets and the head magnet make a significant contribution to the densification of the field lines and consequently improved the speed and quality of deposit.

Figure 6:
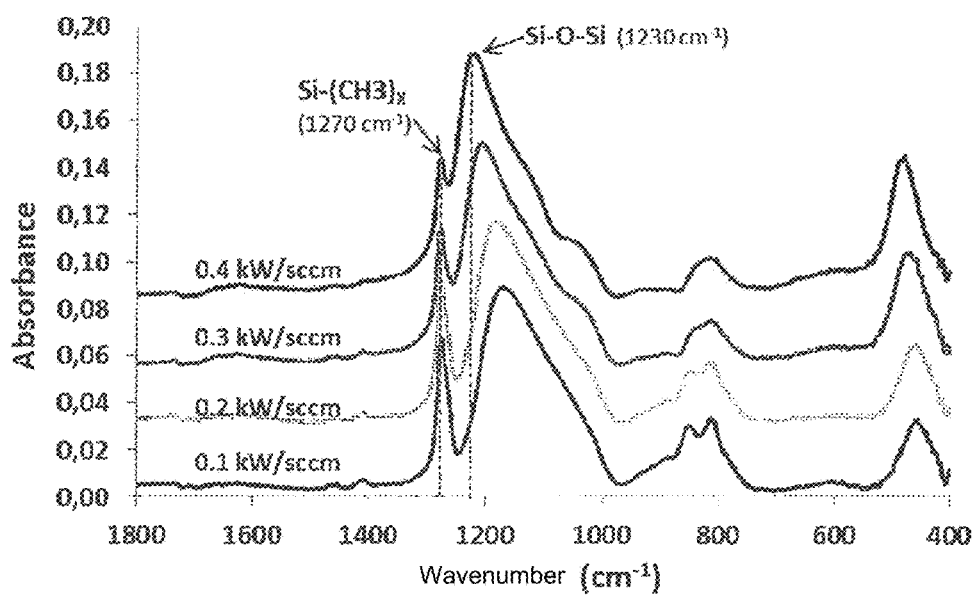
FIG. 6 shows the results of spectrometry analysis by Fourier Transform of silica deposits obtained using a plasma source of the prior art.

FIG. 6 gives the results of spectroscopy analysis by Fourier Transform of the silica deposits obtained using a prior art plasma source for which the electrical power (in kW) was caused to vary in relation to the flow rate of precursor gas (hexamethyldisiloxane or HMDSO), the flow rate being expressed in standard $cm^3$ per second (sccm). The deposits were performed under the following conditions: ionisable gas $O_2$, $O_2$/HMDSO ratio of 5, pressure of 0.2 mbar, substrate-plasma source distance of 50 mm. It was found that with a low $O_2$/HMDSO ratio the silica deposits obtained were of organic nature (presence of Si—(CH3)x bonds–peak at 1270 $cm^{-1}$) irrespective of the power applied. This organic nature is undesirable since it deteriorates the quality of the coating.

Figure 7:
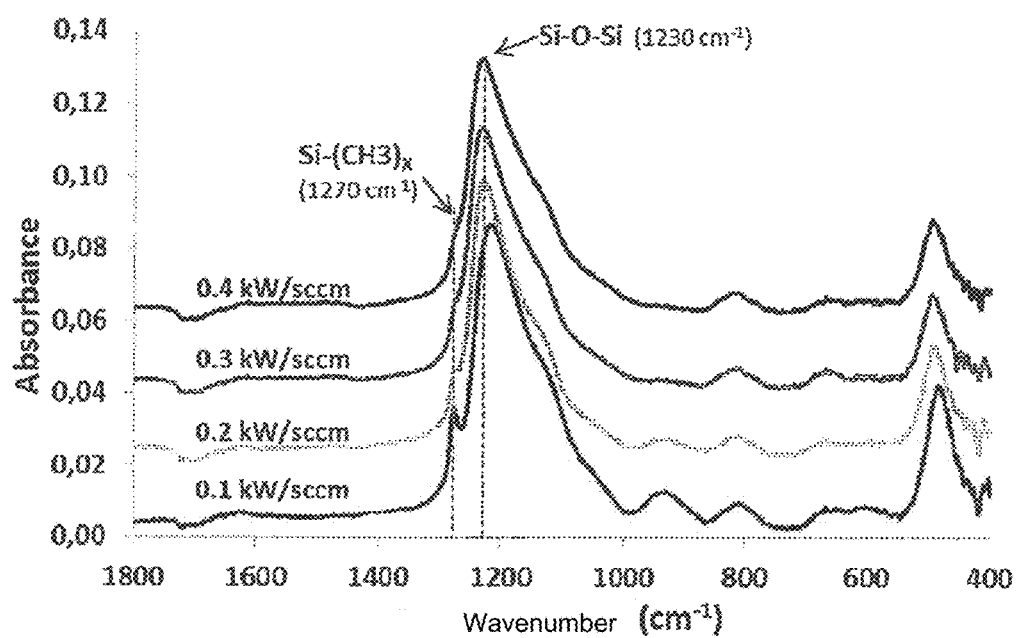
FIG. 7 shows the results of spectrometry analysis by Fourier Transform of silica deposits obtained using a plasma source according to the invention.

FIG. 7 shows the results of spectroscopy analysis by Fourier Transform of silica deposits obtained using a plasma source of the invention. The deposits were obtained under the same conditions as those in FIG. 6. It was found that with powers higher than 0.2 kW/sccm the silica deposits obtained are inorganic (disappearance of the peak at 1270 $cm^{-1}$) and hence of much better quality.

These results also illustrate that the plasma source of the invention allows inorganic silica deposits to be obtained with slower oxygen flow rates and higher pressures than in the prior art. This has the advantage of minimising the pumping rate in the treatment chamber and hence minimising the number of pumps required.

The configuration of the described plasma source, compared with the prior art, also allows an increase in deposition rate to obtain higher deposition yields. The deposition yield can reach 80%, much higher than in the state of the art in which the yield is in the order of 40-50%. The deposition yield for a silica deposit is defined as the proportion of silicon atoms of HMDSO found in the formed silica layer.

The present invention is evidently in no way limited to the embodiments described above and numerous modifications can be made thereto without departing from the scope of the appended claims.

The invention claimed is:

1. A plasma source (1) intended for the depositing of a coating on a substrate (9) and able to be connected to a power source (P), comprising:

a) an electrode (2) delimiting a discharge cavity (3) leading onto an aperture (6) opposite which the said substrate can be positioned, the cross-section of the said electrode comprising a first and a second side wall (21, 22) positioned either side of a bottom part (23, 24) provided with a central portion protruding into the said discharge cavity, the said central portion comprising a first and a second central wall (26, 27) and a top part (28) joining together the two central walls (26, 27), each of said first and second central walls (26, 27) having a smaller extension than said first and a second side wall (21, 22) from said bottom part (23, 24), said bottom part comprising a first (23) and second bottom wall (24);

b) a magnet assembly (4) located on the periphery of the said electrode and comprising a set of magnets connected together by a magnetic bracket (46), each of said magnets comprising an exposed pole directed towards the discharge cavity and a protected pole directed towards the said magnetic bracket, the said magnet assembly comprising:

i) at least a first and a second side magnet (41, 42), the said first side magnet, respectively second side magnet, being arranged behind the said first side wall (21) and second side wall (22) respectively, in the vicinity of the said aperture (6), the said side magnets being oriented such that their exposed poles have the same polarity;

ii) at least a first and a second central magnet (43, 44), the said first central magnet, and second central magnet respectively, being arranged behind the said first central wall (26) and second central wall (27) respectively, the said two central magnets (43, 44) being oriented such that their exposed pole is of opposite polarity to that of the exposed poles of the side magnets, said first central magnet (43) being located at a smaller average distance from said first bottom wall (23) than said first side magnet (41), said second central magnet (44) being located at a smaller average distance from said second bottom wall (24) than said second side magnet (42);

iii) at least one head magnet (45) arranged behind the said top part (28) and oriented such that its exposed pole is of same polarity as that of the exposed poles of the side magnets;

c) an electrically insulating enclosure (5) arranged so as to surround the electrode and the magnets without obstructing the said aperture.

2. The plasma source according to claim 1 wherein the aperture (6) is of the same width as the discharge cavity.

3. The plasma source according to claim 1 wherein the magnetic bracket is E-shaped with the middle bar comprising an enlarged end part so that the protected pole of the head magnet (45) is fully in contact with the magnetic bracket.

4. The plasma source according to claim 1 wherein the magnetic bracket is formed of a single piece.

5. The plasma source according to claim 1 further comprising cooling means (7) to cool the magnets and electrode.

6. The plasma source according to claim 5 wherein the cooling means comprise a space (7) arranged between the electrode and the magnet assembly and intended for circulation of a heat-exchange fluid.

7. The plasma source according to claim 5 wherein the cooling means (7) comprise a piping circuit.

8. The plasma source according to claim 1 further comprising injection means (8) to inject an ionisable gas into the discharge cavity (3).

9. The plasma source according to claim 8 wherein the injection means (8) are positioned in the vicinity of the bottom part (23, 24).

10. Vacuum deposition equipment comprising a plasma source according to claim 1.

11. The vacuum deposition equipment according to claim 10 further comprising a second plasma source (1), the two plasma sources being intended for dual operation, wherein the second plasma source comprises:

a) an electrode (2) delimiting a discharge cavity (3) leading onto an aperture (6) opposite which the said substrate can be positioned, the cross-section of the said electrode comprising a first and a second side wall (21, 22) positioned either side of a bottom part (23, 24) provided with a central portion protruding into the said discharge cavity, the said central portion comprising a first and a second central wall (26, 27) and a top part (28) joining together the two central walls;

b) a magnet assembly (4) located on the periphery of the said electrode and comprising a set of magnets connected together by a magnetic bracket (46), each of said magnets comprising an exposed pole directed towards the discharge cavity and a protected pole directed towards the said magnetic bracket, the said magnet assembly comprising:

i) at least a first and a second side magnet (41, 42), the said first side magnet, respectively second side magnet, being arranged behind the said first side wall (21) and second side wall (22) respectively, in the vicinity of the said aperture (6), the said side magnets being oriented such that their exposed poles have the same polarity;

ii) at least a first and a second central magnet (43, 44), the said first central magnet, and second central magnet respectively, being arranged behind the said first central wall (26) and second central wall (27) respectively, the said two central magnets being oriented such that their exposed pole is of opposite polarity to that of the exposed poles of the side magnets;

iii) at least one head magnet (45) arranged behind the said top part (28) and oriented such that its exposed pole is of same polarity as that of the exposed poles of the side magnets;

c) an electrically insulating enclosure (5) arranged so as to surround the electrode and the magnets without obstructing the said aperture.

12. The vacuum deposition equipment according to claim 10 wherein the axes of symmetry of the two plasma sources form an angle α of between 20 and 110°.

13. The vacuum deposition equipment according to claim 11 wherein facing poles of the side magnets of the first plasma source are of opposite polarity to the polarity of facing poles of the side magnets of the second plasma source.

14. The vacuum deposition equipment according to claim 10 further comprising an injector (10) to inject precursor gas.

15. The vacuum deposition equipment according to claim 10 further comprising an additional magnet (11) positioned facing the aperture (6) and intended to lie in the vicinity of the substrate (9) on the side opposite the plasma source (1) and having a pole directed towards the plasma source 1 of opposite polarity to that of the poles facing one another of the side magnets.

* * * * *